(12) United States Patent
Futami

(10) Patent No.: US 11,296,480 B2
(45) Date of Patent: Apr. 5, 2022

(54) LASER LIGHT SOURCE APPARATUS AND METHOD OF MANUFACTURING THE SAME

(71) Applicant: Mitsubishi Electric Corporation, Tokyo (JP)

(72) Inventor: Mitsuaki Futami, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 208 days.

(21) Appl. No.: 16/644,093

(22) PCT Filed: Oct. 31, 2017

(86) PCT No.: PCT/JP2017/039302
§ 371 (c)(1),
(2) Date: Mar. 3, 2020

(87) PCT Pub. No.: WO2019/087290
PCT Pub. Date: May 9, 2019

(65) Prior Publication Data
US 2021/0296860 A1    Sep. 23, 2021

(51) Int. Cl.
*H01S 5/02* (2006.01)
*H01S 5/00* (2006.01)
(Continued)

(52) U.S. Cl.
CPC .............. *H01S 5/02* (2013.01); *H01S 5/005* (2013.01); *H01S 5/0216* (2013.01);
(Continued)

(58) Field of Classification Search
CPC .......... H01S 5/02; H01S 5/005; H01S 5/0216; H01S 5/02212; H01S 5/02253; H01S 5/02315; H01S 5/4025
See application file for complete search history.

(56) References Cited

U.S. PATENT DOCUMENTS

2013/0057834 A1* 3/2013 Yoshida .................... F21V 5/04
 353/38
2014/0029637 A1* 1/2014 Schmidt .............. H01S 5/02212
 372/44.01

FOREIGN PATENT DOCUMENTS

JP       5453927 B2     3/2014
JP       5835606 B2    12/2015
WO   WO-2018045597 A1 *  3/2018  ......... H01S 5/02469

OTHER PUBLICATIONS

International Search Report (PCT/ISA/210) issued in PCT/JP2017/039302, dated Jan. 30, 2018.

* cited by examiner

*Primary Examiner* — Yuanda Zhang
(74) *Attorney, Agent, or Firm* — Birch, Stewart, Kolasch & Birch, LLP

(57) ABSTRACT

It is an object to provide a technique of achieving a high in-plane mounting density of a laser light source element and capable of adjusting a position of a lens for each laser light source element with a high degree of accuracy. A laser light source apparatus 1 includes: a base; a plurality of semiconductor laser elements; a plurality of lenses parallelizing laser light being output from the plurality of laser light source elements; a spacer disposed on the upper surface of the base; and an adhesive agent fixing the plurality of lenses to the spacer. The spacer includes, for each of the lenses, an annular support surface and a wall, and the wall has a clearance groove formed along a direction connecting diagonal points of the lattice points.

7 Claims, 18 Drawing Sheets

(51) Int. Cl.
*H01S 5/02253* (2021.01)
*H01S 5/02212* (2021.01)
*H01S 5/40* (2006.01)
*H01S 5/02315* (2021.01)
*G03B 21/20* (2006.01)

(52) U.S. Cl.
CPC ...... *H01S 5/02212* (2013.01); *H01S 5/02253* (2021.01); *H01S 5/02315* (2021.01); *H01S 5/4025* (2013.01); *G03B 21/2033* (2013.01)

F I G. 1
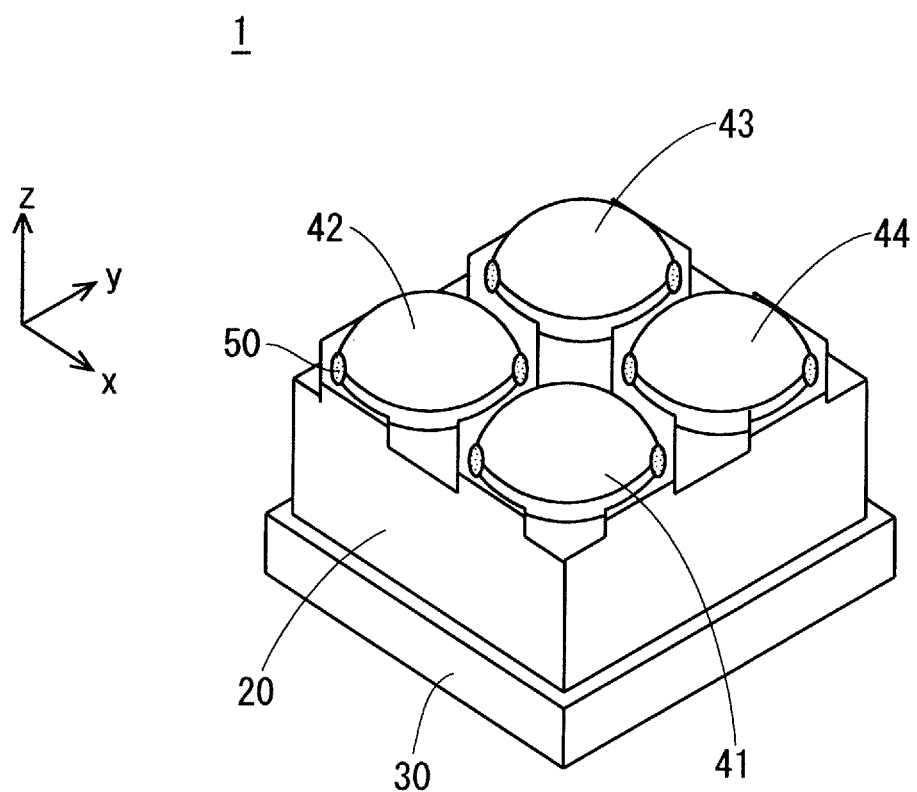

F I G. 2
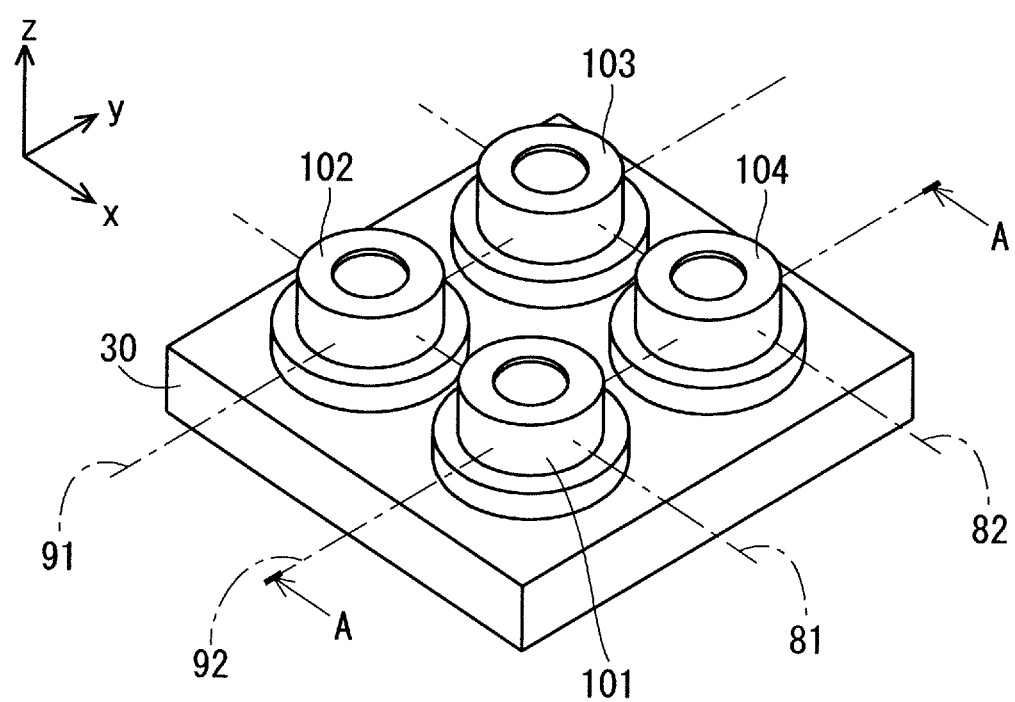

a=b, STRAIGHT LINE 81 ⊥ STRAIGHT LINE 91

F I G. 7
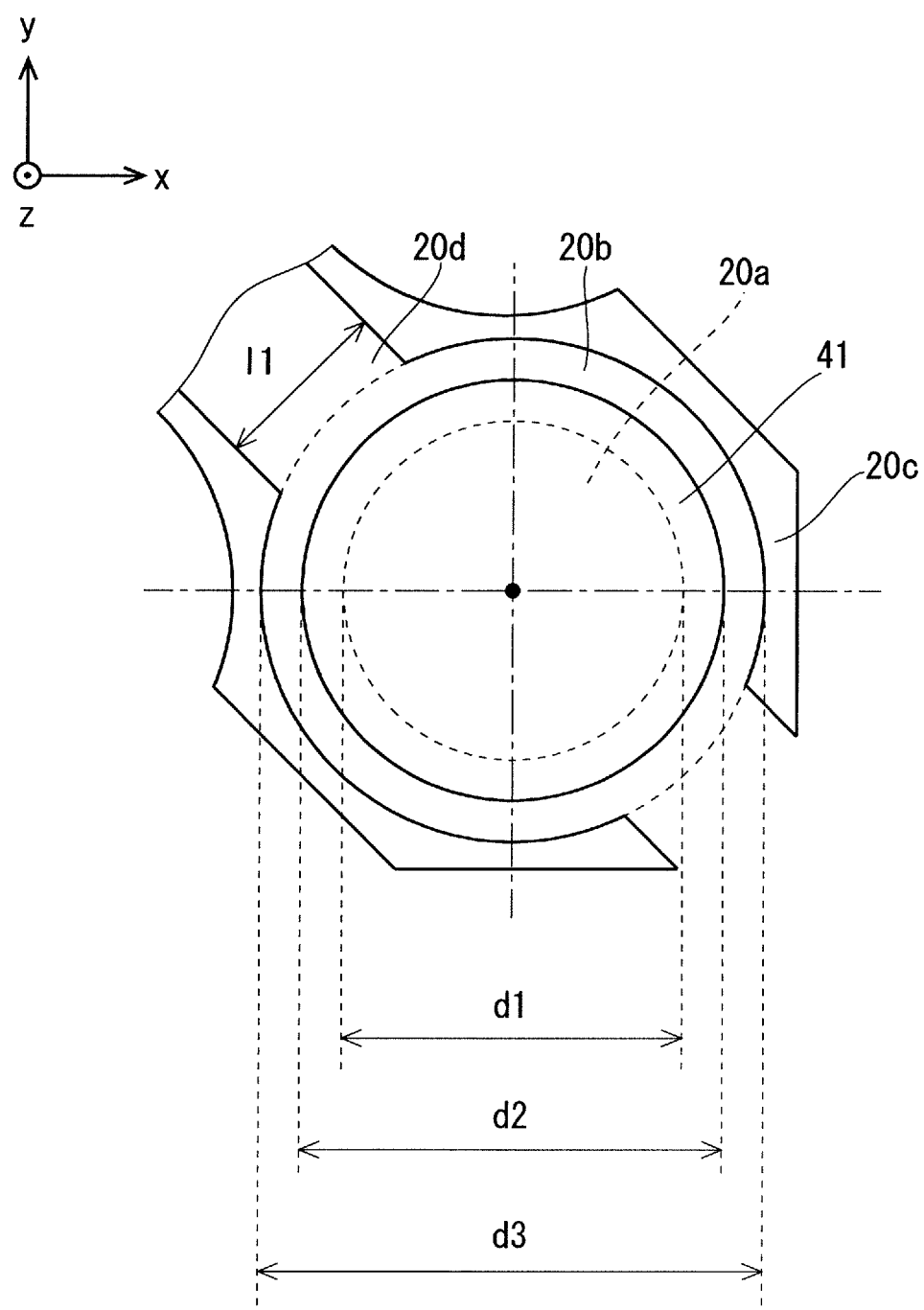

a<b, STRAIGHT LINE 81 ⊥ STRAIGHT LINE 91 a=b, STRAIGHT LINE 81 AND STRAIGHT LINE 91
ARE NOT PERPENDICULAR TO EACH OTHER

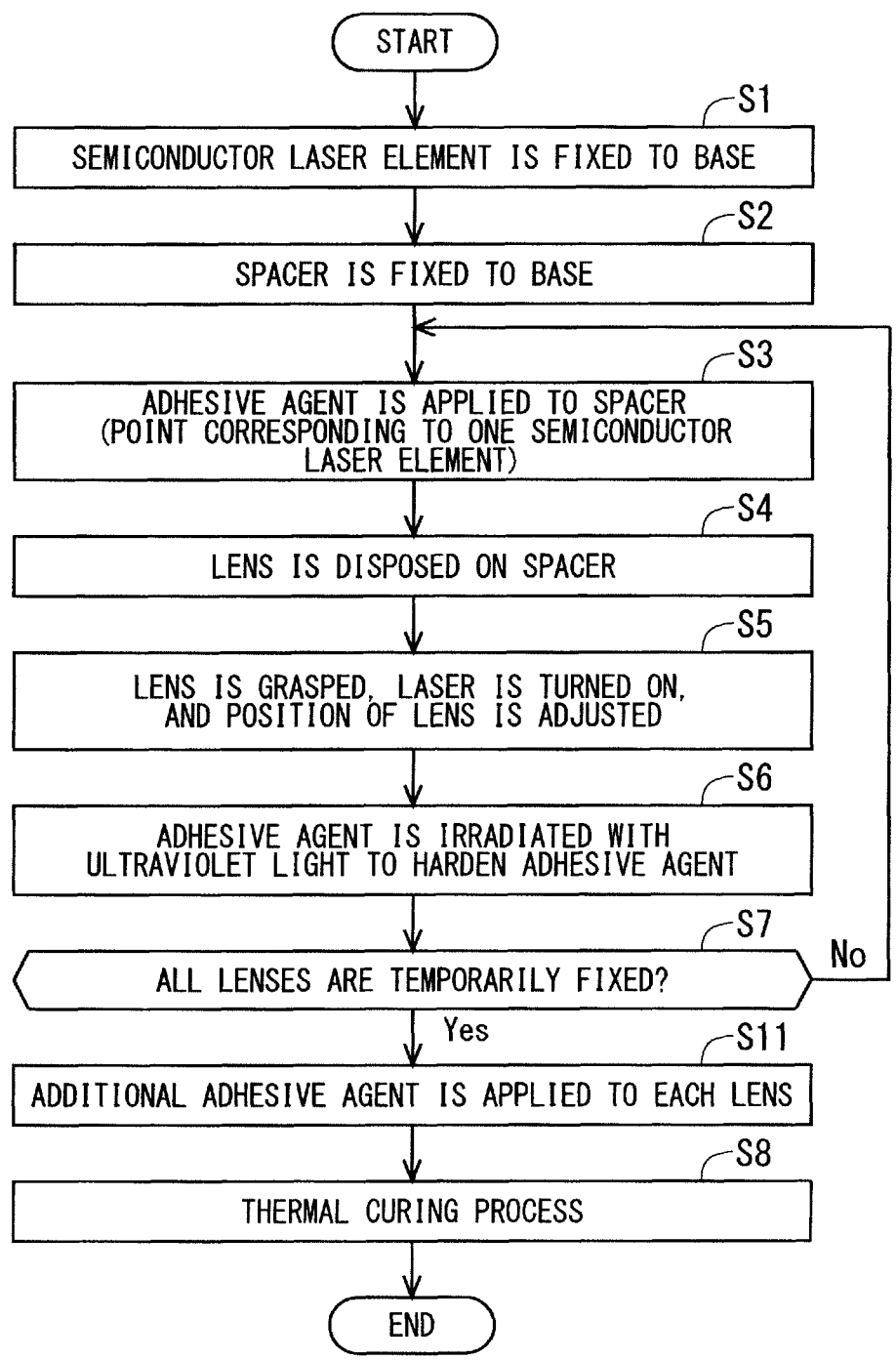

LASER LIGHT SOURCE APPARATUS AND METHOD OF MANUFACTURING THE SAME

TECHNICAL FIELD

The present invention relates to a configuration and a holding structure for incorporating a plurality of laser oscillation elements into a common housing and a manufacturing method thereof in a laser light source apparatus including a laser oscillation element such as a semiconductor laser element.

BACKGROUND ART

Recently, a semiconductor laser element (also referred to as "a laser light source element" hereinafter) attracts attention as a light source of a projection display apparatus such as a projector. The semiconductor laser element has excellent characteristics such as monochromaticity and high directionality of oscillated light and lower power consumption, and is expected as a light source as a replacement for a lamp which is widely distributed currently. However, in the current semiconductor laser element, it is difficult to achieve output required for the projection display apparatus with one element, so that the plurality of laser oscillation elements are generally mounted to constitute a light source of the projection display apparatus.

When the plurality of semiconductor laser elements are amounted to constitute the light source of the projector, the semiconductor laser elements are preferably disposed as close to each other as possible from a viewpoint of an optical design. The reason is that an optical element necessary to spatially synthesizing a beam and a display device such as a digital mirror device (DMD) and a liquid crystal display (LCD) can be downsized and costs for a system can be reduced by reducing a light emitting area.

Furthermore, a high-accuracy control on an output light in a propagation direction is required to achieve a high-luminance projector. This high-accuracy control is achieved by providing a laser light source system with a mechanism of adjusting a positional relationship between a lens and a semiconductor laser element.

For example, Patent Document 1 discloses a mechanism of adjusting a position of a lens when a holding member of a lens is fixed to the other support member by welding against the problem described above.

Patent Document 2 discloses a technique of using a lens array for a plurality of semiconductor laser elements to improve an in-plane mounting density. Patent Document 2 discloses a mechanism of adjusting a position of a lens array using a lens holder.

PRIOR ART DOCUMENTS

Patent Documents

Patent Document 1: Japanese Patent No. 5453927
Patent Document 2: Japanese Patent No. 5835606

SUMMARY

Problem to be Solved by the Invention

Patent Document 1 is disadvantageous to an increase of the in-plane mounting density of the semiconductor laser elements by reason that a lens tube for holding the lens causes a functional limiting condition in arranging the plurality of semiconductor laser elements and. The lens needs to be downsized in conformity to the lens tube when the lens tube is downsized for purpose of increasing the in-plane mounting density, and a freedom degree of an optical design decreases.

The lens array is used in Patent Document 2, so that it is difficult to optimize the position of the lens for each semiconductor laser element.

Thus, it is an object of the present invention to provide a technique of achieving a high in-plane mounting density of a laser light source element and capable of adjusting a position of a lens for each laser light source element with a high degree of accuracy.

Means to Solve the Problem

A laser light source apparatus according to the present invention includes: a base whose upper surface is a flat surface; a plurality of laser light source elements arranged on the upper surface of the base and also on lattice points which are intersection points between an x axis group and a y axis group, in which an x axis directed to a direction parallel to the upper surface of the base and a y axis directed to a direction parallel to the upper surface of the base and a direction intersecting with the x axis are arranged, respectively; a plurality of lenses parallelizing laser light being output from the plurality of laser light source elements; a spacer disposed on the upper surface of the base to support the plurality of lenses; and an adhesive agent fixing the plurality of lenses to the spacer, wherein the spacer includes, for each of the lenses, an annular support surface supporting a lower surface of each of the lenses and a wall to which a side surface of each of the lenses is fixed by the adhesive agent, and the wall has a clearance groove formed along a direction connecting diagonal points of the lattice points.

Effects of the Invention

According to the present invention, a laser light source apparatus includes: a base whose upper surface is a flat surface; a plurality of laser light source elements arranged on the upper surface of the base and also on lattice points which are intersection points between an x axis group and a y axis group, in which an x axis directed to a direction parallel to the upper surface of the base and a y axis directed to a direction parallel to the upper surface of the base and a direction intersecting with the x axis are arranged, respectively; a plurality of lenses parallelizing laser light being output from the plurality of laser light source elements; a spacer disposed on the upper surface of the base to support the plurality of lenses; and an adhesive agent fixing the plurality of lenses to the spacer, wherein the spacer includes, for each of the lenses, an annular support surface supporting a lower surface of each of the lenses and a wall to which a side surface of each of the lenses is fixed by the adhesive agent, and the wall has a clearance groove formed along a direction connecting diagonal points of the lattice points.

Accordingly, the laser light source apparatus does not include a lens tube for holding the lens, but the plurality of lenses are fixed to the spacer, thus a high in-plane mounting density in the laser light source element can be achieved. The lens can be grasped along the clearance groove provided in the spacer, thus a position of the lens can be adjusted with a high degree of accuracy.

These and other objects, features, aspects and advantages of the technique disclosed in the specification of the present application will become more apparent from the following detailed description of the present invention when taken in conjunction with the accompanying drawings.

BRIEF DESCRIPTION OF DRAWINGS

FIG. 1 A perspective view of a laser light source apparatus according to an embodiment. 1.

FIG. 2 A perspective view of a laser light source apparatus from which a spacer and a lens are removed.

FIG. 7 An enlarged plan view of a wall of the spacer and a surrounding area thereof.

FIG. 24 A flow chart illustrating an example of a method of manufacturing the laser light source apparatus according to the embodiment 2.

DESCRIPTION OF EMBODIMENT(S)

Embodiment 1

Figure 3:
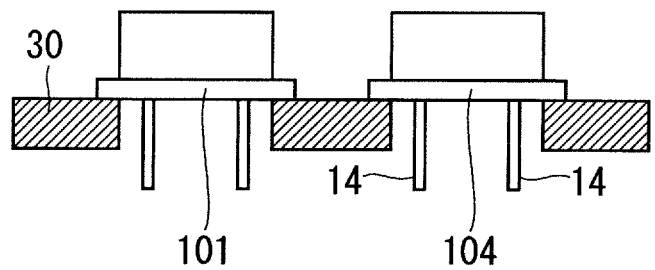
FIG. 3 A cross-sectional view along an A-A line in FIG. 2.

An embodiment 1 according to the present invention is described hereinafter using the drawings. Firstly, a whole configuration of a laser light source apparatus 1 according to the embodiment 1 is described using FIG. 1 to FIG. 3. FIG. 1 is a perspective view of the laser light source apparatus 1 according to the embodiment 1. FIG. 2 is a perspective view of the laser light source apparatus 1 from which a spacer 20 and lenses 41 to 44 are removed. FIG. 3 is a cross-sectional view along an A-A line in FIG. 2.

As illustrated in FIG. 1 to FIG. 3, the laser light source apparatus 1 includes semiconductor laser elements 101 to 104 as laser light source elements, the lenses 41 to 44, the spacer 20, a base 30, and an adhesive agent 50. The laser light source apparatus 1 further includes a drive circuit (not shown) and applies current to the semiconductor laser elements 101 to 104 through the drive circuit to obtain light output in which light is parallelized by the lenses 41 to 44.

Figure 4:
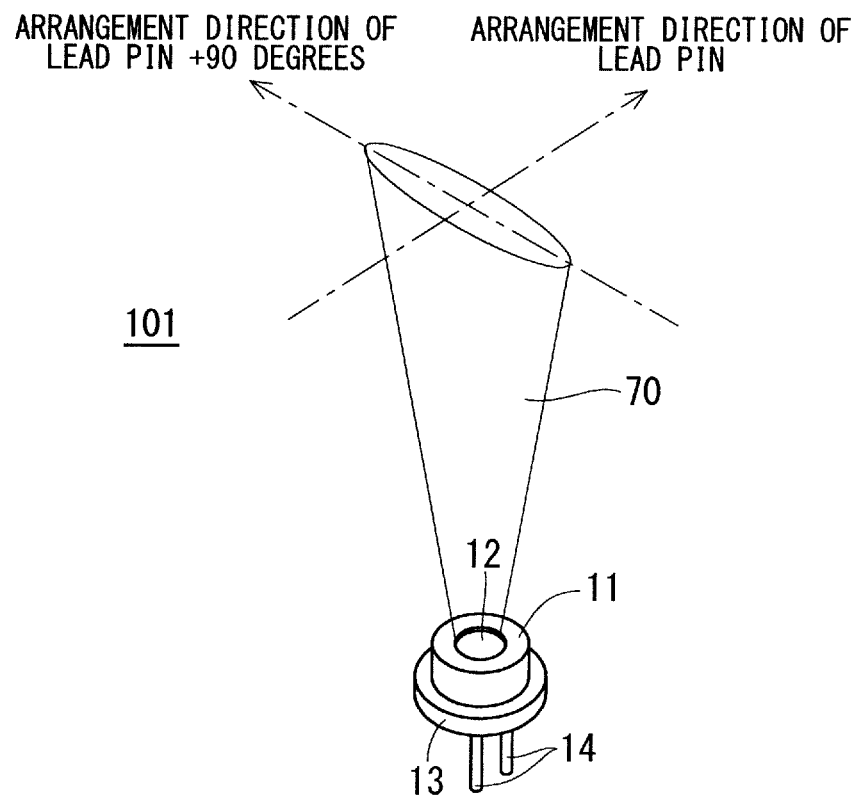
FIG. 4 A perspective view of a semiconductor laser element.

Next, the semiconductor laser elements 101 to 104 are described using FIG. 4. FIG. 4 is a perspective view of the semiconductor laser element 101. The semiconductor laser elements 101 to 104 have the same structure, thus the semiconductor laser element 101 is described herein.

As illustrated in FIG. 4, the semiconductor laser element 101 is a TO-Can type package semiconductor laser element, for example. The TO-Can type semiconductor laser element includes a cap 11, a glass window 12, a stem 13, a lead pin 14, and a semiconductor chip (not shown) provided on an inner side of the cap 11. A main material of the semiconductor laser chip is a compound semiconductor made of GaAs and InGaN, for example, and the semiconductor laser chip outputs light to the stem 13 in substantially a vertical direction. Generally, an end surface of the semiconductor laser chip is easily broken when moisture and a powder dust in the air adhere to the end surface during driving the semiconductor laser chip. However, an air sealing is maintained by the cap 11 in the TO-Can package element, thus a condition required for a driving environment is reduced. The TO-Can type package semiconductor laser element is small in size, thus the number of semiconductor laser elements to be used is easily adjusted, that is to say, light output corresponding to a required specification is easily increased and reduced.

The semiconductor laser element whose end surface emits light has characteristics that a spread of output light in a direction perpendicular to an active layer, that is to say, a direction along a fast axis is approximately ten times as large as that of the output light in a direction horizontal to the active layer, that is to say, a direction along a slow axis. Accordingly, as illustrated in FIG. 4, a cross section of output light 70 in a propagation direction, that is to say, a far-field pattern takes a form of an ellipse. FIG. 4 is a perspective view of the semiconductor laser element 101. Generally, in the TO-Can package type semiconductor laser element, the active layer of the semiconductor laser element is horizontal to a direction of the two lead pins 14, thus as illustrated in FIG. 4, the spread of the output light in an arrangement direction of the lead pins 14 is small, and the spread of the output light 70 along an axis inclined with respect to the arrangement direction at an angle of 90 degrees is large.

As illustrated in FIG. 1 and FIG. 2, the base 30 is a base mainly made up of a high thermal conductive material such as metal such as Cu and Al or a ceramic of SiC and AlN, for example, for supporting the semiconductor laser elements 101 to 104. An upper surface of the base 30 is a flat surface. In the drawings, x, y, and z axes provided for explanation are a rectangular coordinate system, and the x axis is directed to a direction parallel to the upper surface of the base 30. The y axis is directed to a direction parallel to the upper surface of the base 30 and a direction intersecting with the x axis. More specifically, the y axis is directed to a direction parallel to the upper surface of the base 30 and a direction orthogonal to the x axis. The z axis is directed to a direction perpendicular to the upper surface of the base 30.

Bottom surfaces of the semiconductor laser elements 101 to 104 are closely attached and fixed to the upper surface of the base 30 with a thermal conductive grease of a sheet-like heat radiation material therebetween. The semiconductor laser elements 101 to 104 and the base 30 are preferably bonded to each other using a solder material mainly made of SuAgCu or AuSn to further increase heat radiation property. The semiconductor laser elements 101 to 104 have the lead pins 14 for applying the current from an external drive system, thus the base 30 has a thorough hole or a groove to release the lead pins 14.

As illustrated in FIG. 2, straight lines 81 and 82 and straight lines 91 and 92 are virtual lines for describing an arrangement of the semiconductor laser elements 101 to 104 on the base 30. The straight lines 81 and 82 and the straight lines 91 and 92 are lines parallel to the x axis and the y axis, and are located on the upper surface of the base 30. Herein, the straight lines 81 and 82 and the straight lines 91 and 92 intersect with each other. More specifically, the straight lines 81 and 82 and the straight lines 91 and 92 are orthogonal to each other. An interval between the straight line 81 and the straight line 82 and an interval between the straight line 91 and the straight line 92 are equal to each other. That is to say, when the interval between the straight line 81 and the straight line 82 and the interval between the straight line 91 and the straight line 92 are defined as a and b, respectively, a relationship in the following expression (1) is satisfied.

[Math 1]

$$a = b \quad (1)$$

Figure 5:
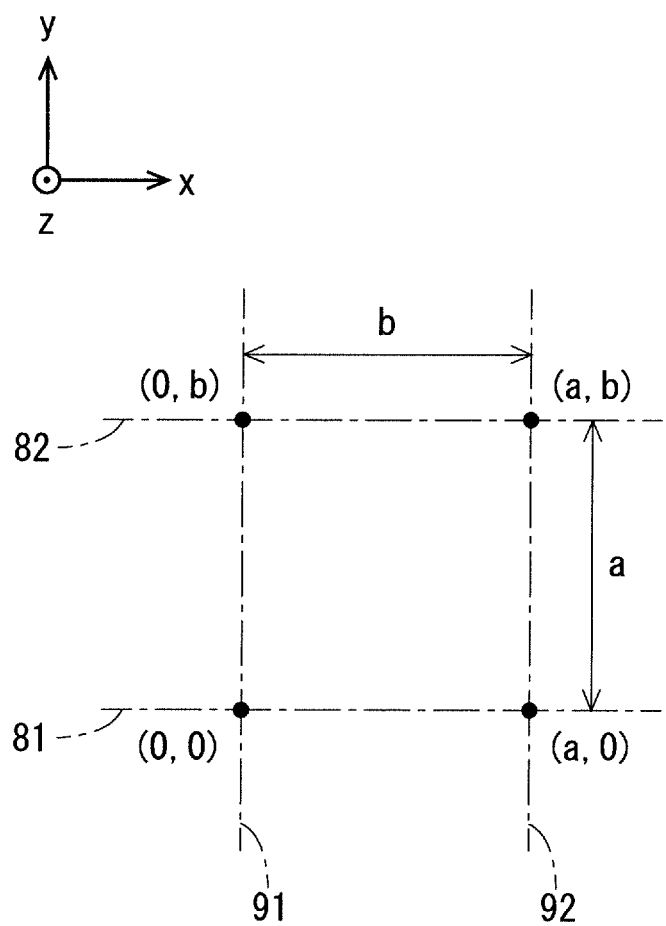
FIG. 5 A diagram for explaining an arrangement of the semiconductor laser element.

The semiconductor laser elements 101 to 104 are arranged so that luminous points thereof are located on intersection points between the straight lines 81 and 82 and the straight lines 91 and 92, that is to say, on square lattice points to form a surface light source. FIG. 5 is a drawing for explaining the arrangement of the semiconductor laser elements 101 to 104. As illustrated in FIG. 5, when the intersection point between the straight line 81 and the straight line 91 is expressed as $(x, y) = (0, 0)$, the luminous points are located in four points of $(x, y) = (0, 0), (a, 0), (0, b),$ and $(a, b)$.

An arrangement interval between the semiconductor laser elements 101 to 104 at this time, that is to say, an arrangement interval between the lattice points depends on a requirement from a system such as a projection display apparatus into which the laser light source apparatus 1 is eventually incorporated, however, the arrangement interval is preferably narrow in general. The reason is that as the interval between the semiconductor laser elements 101 to 104 gets narrower, that is to say, as a light emitting area of the light source gets smaller, an optical component used in the projection display apparatus can be made small, thus a manufacturing cost of the system can be reduced. The straight lines 81 and 82 correspond to an x axis group, and the straight lines 91 and 92 correspond to a y axis group.

As illustrated in FIG. 1, the lenses 41 to 44 are lenses for parallelizing laser light (also referred to as "output light" hereinafter) being output from the semiconductor laser elements 101 to 104, and each has an axisymmetric spherical surface or aspherical surface as an upper surface. In the semiconductor laser element, particularly in the semiconductor laser element whose end surface emits light, a light output part is extremely small for an oscillation wavelength, thus a spread of beam due to a diffractive effect occurs. Particularly, the spread of the beam in a direction along an epitaxial growth direction of the semiconductor laser chip, that is to say, the spread in the fast axis direction is approximately 60 degree in full angle. Thus, the lenses 41 to 44 having a collimation action are disposed in positions relatively close to the semiconductor laser elements 101 to 104 to keep a beam size substantially constant with respect to an output distance. In each of the lenses 41 to 44, an entrance surface from which the laser light enters from the semiconductor laser elements 101 to 104 is a flat surface, and an output surface from which the laser light is output is a curved surface. The lenses 41 to 44 have a general circular shape in a planar view. The entrance surfaces of the lenses 41 to 44 constitute lower surfaces and the output surfaces constitute upper surfaces.

At this time, the lenses 41 to 44 need to be supported at a predetermined interval with the semiconductor laser elements 101 to 104, and the spacer 20 is provided to achieve this configuration. The spacer 20 is a rectangular parallelepiped housing mainly made of metal or resin. The predetermined interval has a value determined by a curved shape of a mounted lens, for example. The spacer 20 is fixed to the base 30, to which the semiconductor laser elements 101 to 104 are bonded, by fastening using a screw, adhesion using an adhesive agent, or both of them.

Figure 6:
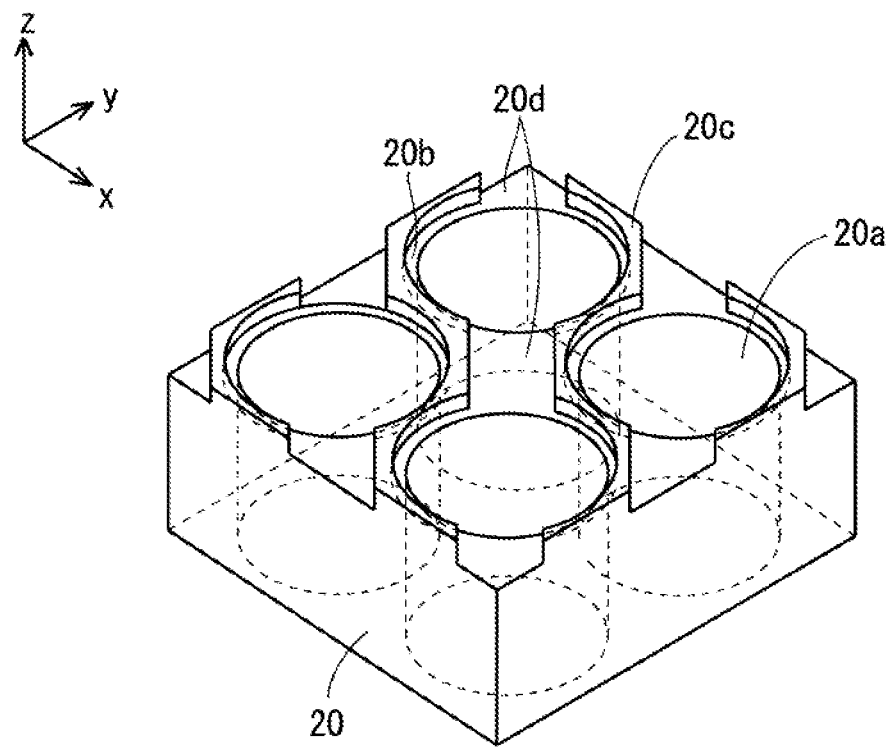
FIG. 6 A perspective view of a spacer.

FIG. 6 is a perspective view of the spacer 20. As illustrated in FIG. 6, the spacer 20 includes, for each of the lenses 41 to 44, a space 20a for internally locating the semiconductor laser elements 101 to 104, a support surface 20b provided on a peripheral edge part of an opening in the space 20a toward an upper surface side of the spacer 20, and a wall 20c protruding from the upper surface of the spacer 20 to be located along the support surface 20b. The support surface 20b has a annular shape and supports the lower surfaces of the lenses 41 to 44. The wall 20c covers almost entire side surfaces of the lenses 41 to 44, and the side surfaces of the lenses 41 to 44 are fixed to the wall 20c by the adhesive agent 50. "The opening in the space 20a toward the upper surface side of the spacer 20" is simply referred to as "the opening of the space 20a" hereinafter.

The space 20a has roles of not only internally locating the semiconductor laser elements 101 to 104 in the spacer 20 but also connecting the laser light being output from the semiconductor laser elements 101 to 104 to the lenses 41 to 44. Accordingly, the opening of the space 20a is formed into a circular shape concentric with the lenses 41 to 44 each having the circular shape. A diameter of the opening of the space 20a is smaller than that of each of the lenses 41 to 44 so that the spacer 20 can support the lenses 41 to 44 on the upper surface of the spacer 20. The wall 20c is also formed into a circular shape concentric with the lenses 41 to 44, and the lenses 41 to 44 are internally located in the concentric circle formed by the wall 20c, thus an inner diameter of the wall 20c is larger than the diameter of each of the lenses 41 to 44.

FIG. 7 is an enlarged plan view of the wall 20c of the spacer 20 and a surrounding area thereof. As illustrated in FIG. 7, a magnitude relationship described above is expressed by the following expression (2) when the diameter of the opening of the space 20a is defined as d1, the diameter of the lens 41 is defined as d2, and the inner diameter of the wall 20c is defined as d3.

[Math 2]

$$d1 < d2 < d3 \quad (2)$$

The diameter d1 of the opening needs to be set not to be extremely smaller than the diameter d2 of the lens 41 to meet a necessity of efficiently connecting the output light being output from the semiconductor laser elements 101 to 104 to the lenses 41 to 44. Specifically, d1 is preferably set to 80% or more and 98% or less of d2. The wall 20c is provided to be located along the side surfaces of the lenses 41 to 44, but is not provided to be located along the entire region of the side surfaces of the lenses 41 to 44.

As illustrated in FIG. 5 to FIG. 7, in the wall 20c, a clearance groove 20d having a width 11 is provided in a direction connecting diagonal points of the square lattice points where the semiconductor laser elements 101 to 104 are located, that is to say, a direction parallel to a straight line connecting a lattice point (0, b) and a lattice point (a, 0). The clearance groove 20d is necessary to grasp the side surfaces of the lenses 41 to 44 when the lenses 41 to 44 are adjusted to be located in optimal positions on the spacer 20.

The lenses 41 to 44 and the spacer 20 are fixed via the adhesive agent 50. Used as the adhesive agent 50 is an epoxy resin adhesive or an acrylic resin adhesive which is an ultraviolet cure adhesive from a viewpoint of manufacturing the laser light source apparatus 1. The wall 20c has a role of easily and firmly bonding and fixing the lenses 41 to 44 and the spacer 20.

Figure 8A:
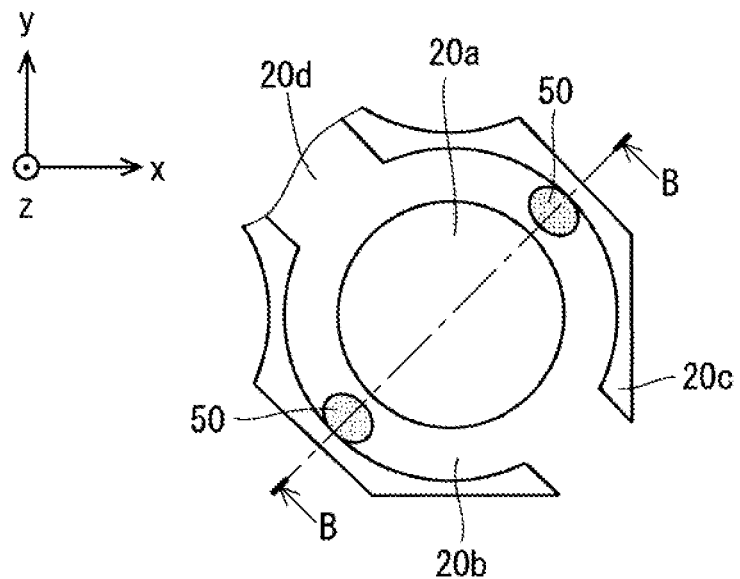
FIGS. 8A and 8B A plan view and a cross-sectional view of the wall of the spacer and the surrounding area before the lens is disposed.
Figure 8B:
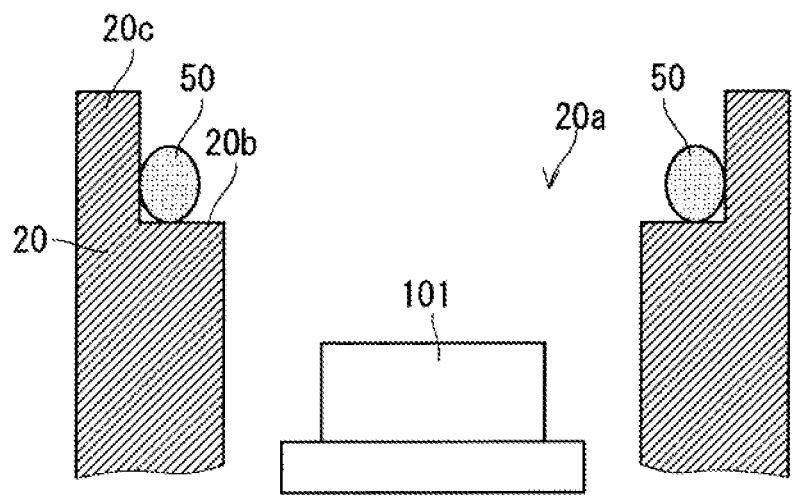
Figure 9A:
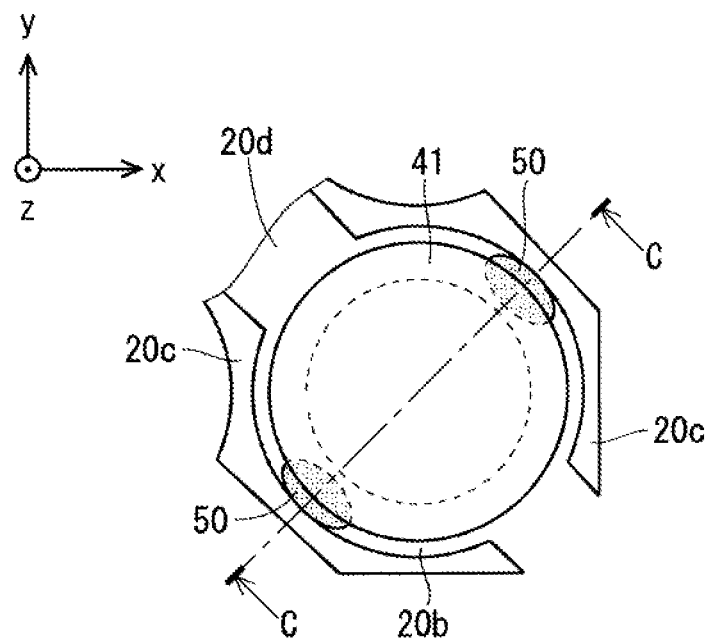
FIGS. 9A and 9B A plan view and a cross-sectional view of the wall of the spacer and the surrounding area after the lens is disposed.
Figure 9B:
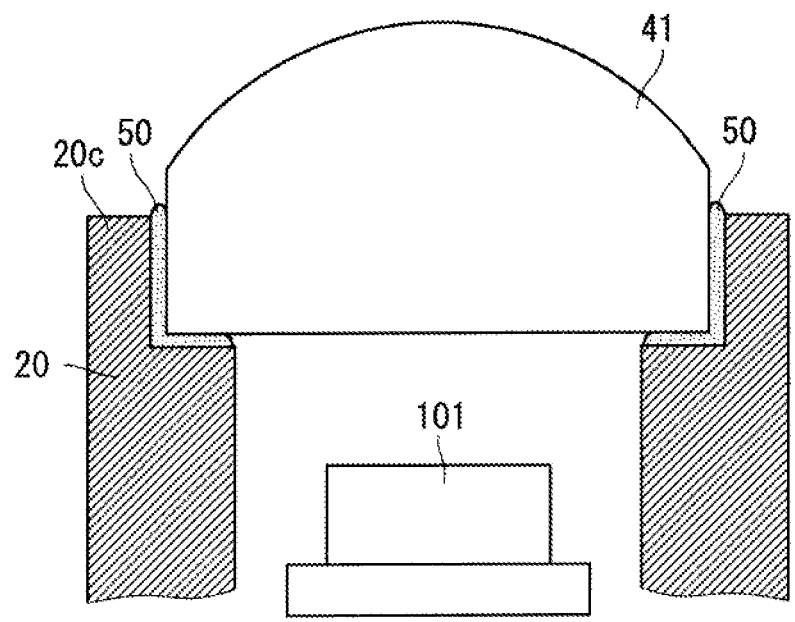
Figure 10:
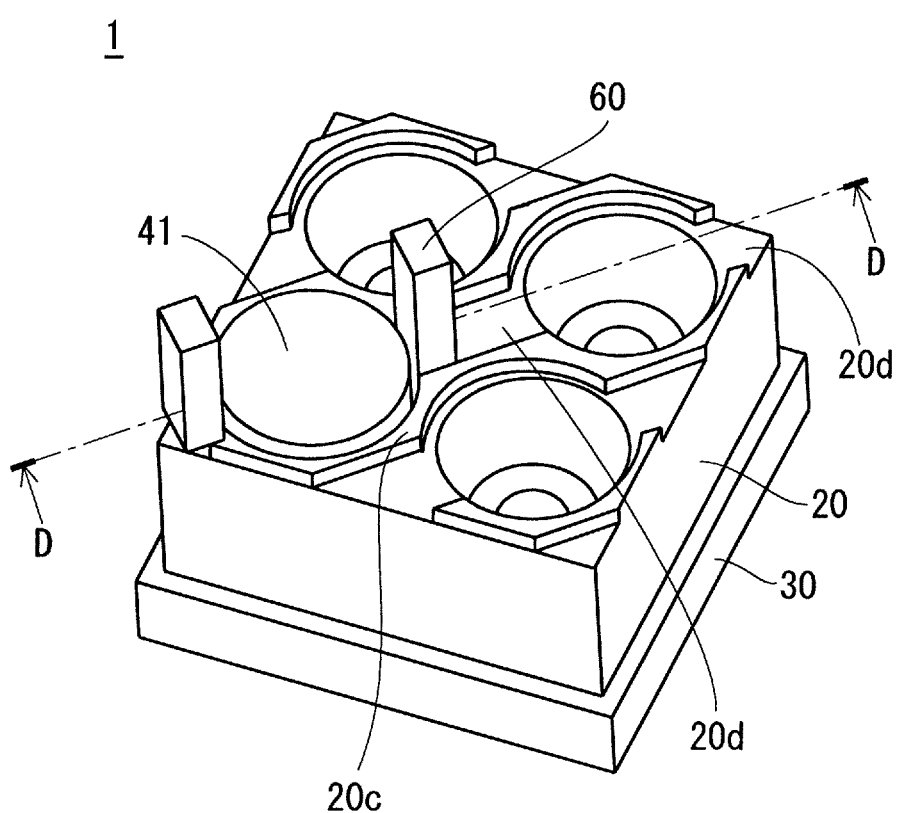
FIG. 10 A perspective view of the laser light source apparatus illustrating a lens adjustment process performed by a lens grasping mechanism.
Figure 11:
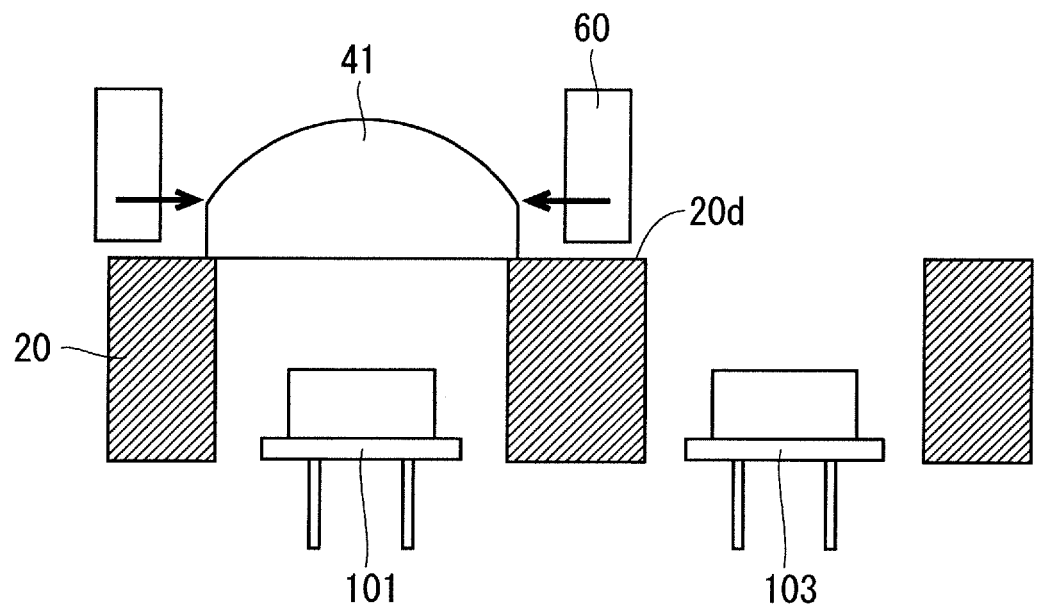
FIG. 11 A cross-sectional view along a D-D line in FIG. 10 and a cross-sectional view illustrating a state before the lens is grasped by the lens gasping mechanism.
Figure 12:
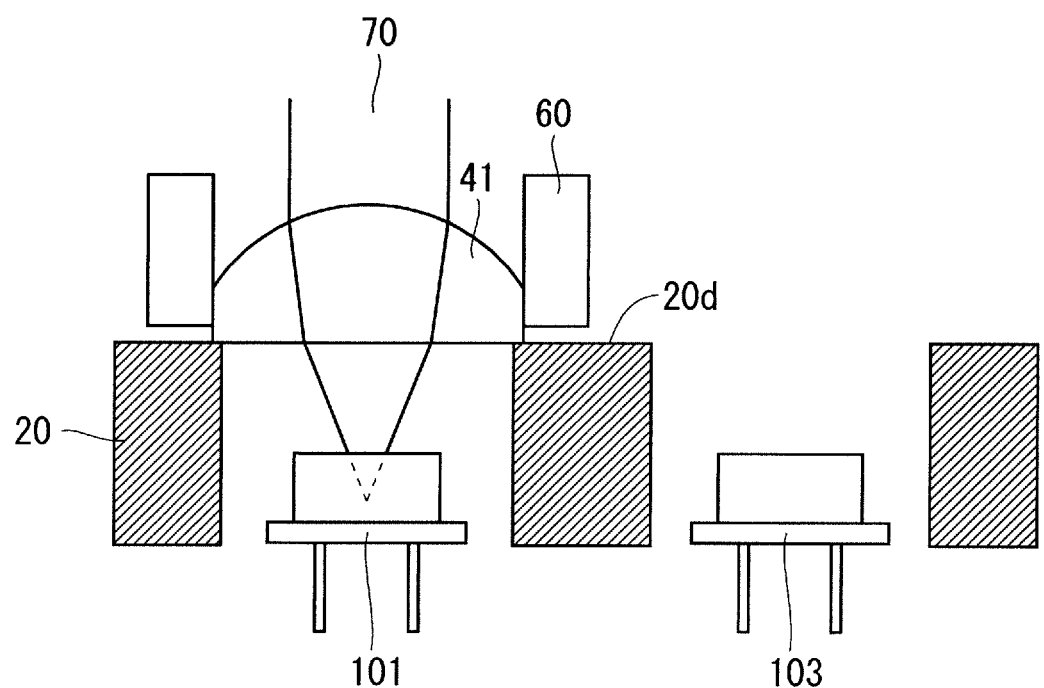
FIG. 12 A cross-sectional view along the D-D line in FIG. 10.
Figure 13:
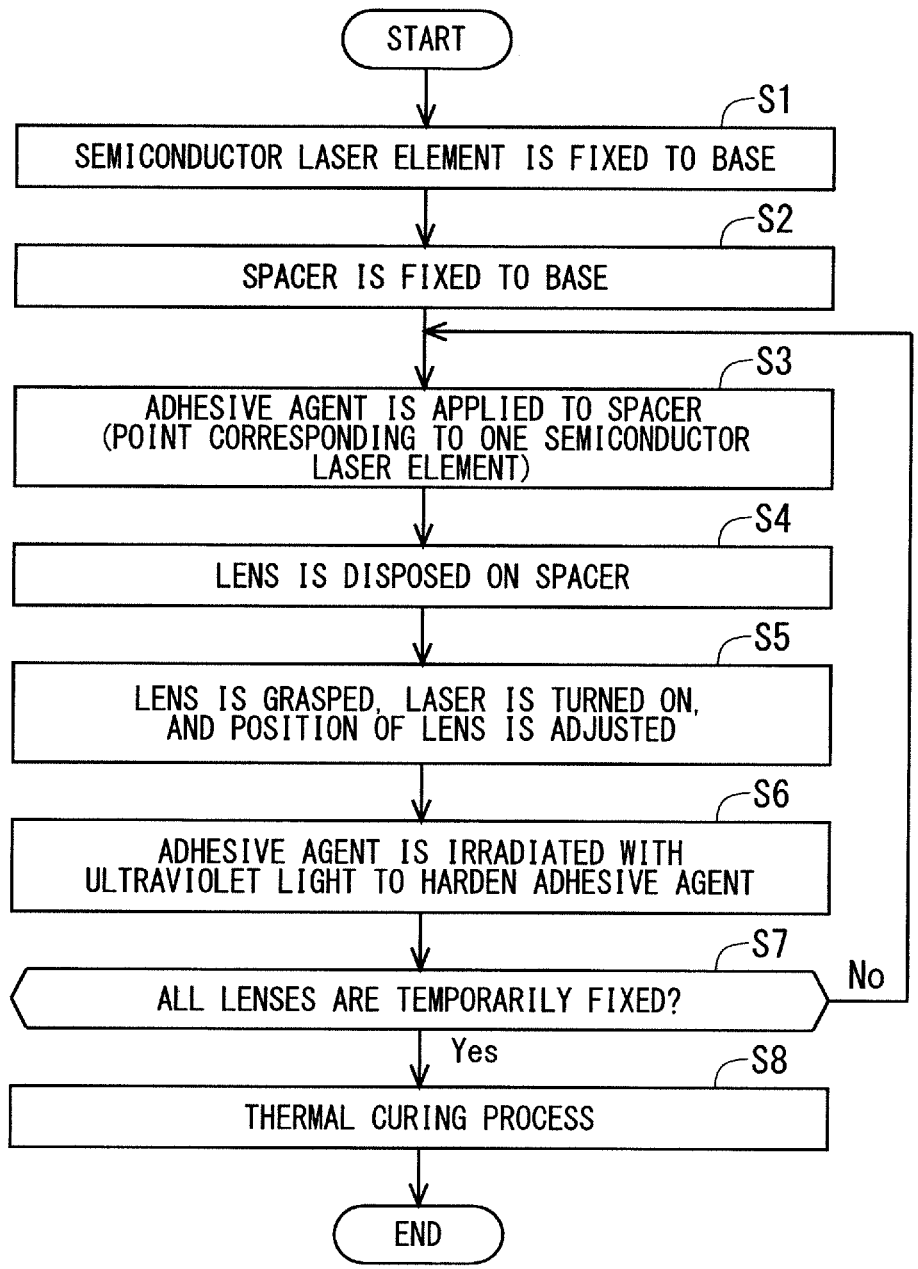
FIG. 13 A flow chart illustrating an example of a method of manufacturing the laser light source apparatus.

Next, a method of manufacturing the laser light source apparatus 1 is described using FIG. 8A to FIG. 13. FIG. 8A is a plan view of the wall 20c of the spacer 20 and the surrounding area thereof before the lens 41 is disposed, and FIG. 8B is a cross-sectional view along a B-B line in FIG. 8A. FIG. 9A is a plan view of the wall 20c of the spacer 20 and the surrounding area thereof after the lens 41 is disposed, and FIG. 9B is a cross-sectional view along a C-C line in FIG. 9A. FIG. 10 is a perspective view of the laser light source apparatus 1 illustrating a process of adjusting the lens 41 by a lens gasping mechanism 60. FIG. 11 is a cross-sectional view along a D-D line in FIG. 10 and a cross-sectional view illustrating a state before the lens 41 is grasped by the lens grasping mechanism 60. FIG. 12 is a cross-sectional view along the D-D line in FIG. 10. FIG. 13 is a flow chart illustrating an example of a method of manufacturing the laser light source apparatus 1. The base 30 is omitted in the cross sections to simplify the drawings.

Firstly, the semiconductor laser elements 101 to 104 are fixed to the base 30 (Step S1). Next, the spacer 20 is fixed to the base 30 (Step S2). As illustrated in FIGS. 8A and 8B, the adhesive agent 50 is firstly applied on the support surface 20b of the spacer 20 in a state where the lens 41 is not disposed when the lens 41 is bonded (Step S3). At this time, the adhesive agent 50 is applied on two positions facing each other with the lens 41 therebetween along the wall 20c in a direction connecting the diagonal points of the square lattice points where the semiconductor laser element 101 is located, that is to say, a direction parallel to a straight line connecting a lattice point (0, 0) and a lattice point (a, b). Subsequently, the lens 41 is disposed on the spacer 20 (Step S4).

At this time, the adhesive agent 50 is sandwiched between the lens 41 and the wall 20c, thereby being peripherally spread, and as a result, as illustrated in FIGS. 9A and 9B, the adhesive agent 50 extends into the side surface and the entrance surface of the lens 41. Accordingly, a wide adhesion area can be ensured compared to a case where there is no wall 20c, thus a higher adhesion strength can be obtained. A height of the wall 20c needs to be set to 20% or more of a width of the side surface of the lens 41 to maintain the adhesion strength, and is preferably set to 50% or more of the width of the side surface of the lens 41 to achieve the firmer fixation.

Subsequently, as illustrated in FIG. 11, the lens grasping mechanism 60 is lowered to the clearance groove 20d in the wall 20c, and operates in directions of arrows. As illustrated in FIG. 10 and FIG. 12, the lens grasping mechanism 60 grasps the side surface of the lens 41, and adjusts the position of the lens 41. The position of the lens 41 is adjusted in a state where the lens grasping mechanism 60 grasping the lens 41 moves on the upper surface of the spacer 20 within a range of the upper surface. Furthermore, the position is adjusted while driving the semiconductor laser element 101 by the current and monitoring the output light 70 being output from the lens 41. That is to say, the position is adjusted by fitting a light source image of the output light 70 into a target position which is predetermined on a screen located at a certain distance (Step S5).

The lens 41 can move along the inner diameter of the wall 20c, however, there is a possibility that a moving range is limited by the lens grasping mechanism 60 and the width 11 of the clearance groove 20d in the wall 20c. Accordingly, the width 11 of the clearance groove 20d in the wall 20c is preferably set in accordance with a necessary moving range of the lens and an outline dimension of the lens grasping mechanism 60.

After the position adjustment of the lens 41 is completed, the adhesive agent 50 is irradiated with ultraviolet light to harden the adhesive agent 50 (Step S6). Subsequently, the processes of applying the adhesive agent, positioning the lens, adjusting the position of the lens, and hardening the adhesive agent by the ultraviolet irradiation are repeated for each of the lenses 42 to 44, for example (Step S7). At this time, the lens 41 has been already hardened by the ultraviolet irradiation, thus in adjusting the other lens, the lens 41 does not move again from the position which has been adjusted once. Then, after the adjustment and the hardening by the ultraviolet irradiation are completed for all the lenses 41 to 44, a thermal curing process is performed in a furnace as necessary (Step S8). This is performed in consideration of a case where the adhesion by the ultraviolet irradiation is not sufficiently performed.

Figure 14:
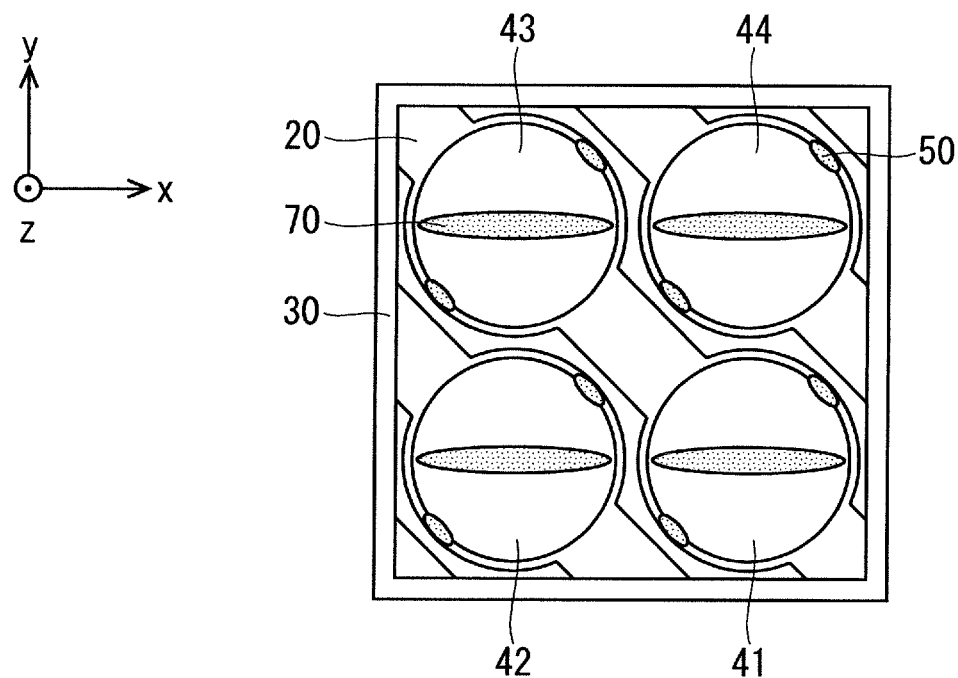
FIG. 14 A drawing illustrating a region where output light passes through an output surface of the lens when the laser light source apparatus is driven.
Figure 15:
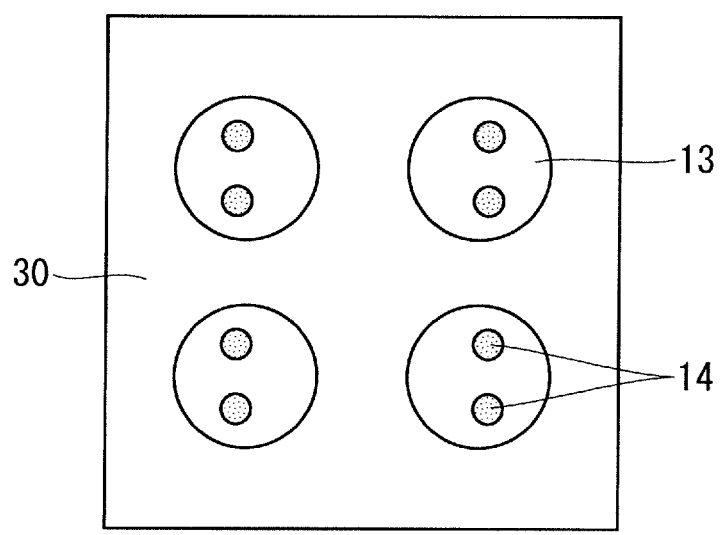
FIG. 15 A drawing for explaining a direction of a lead pin in the case illustrated in FIG. 14.
Figure 16:
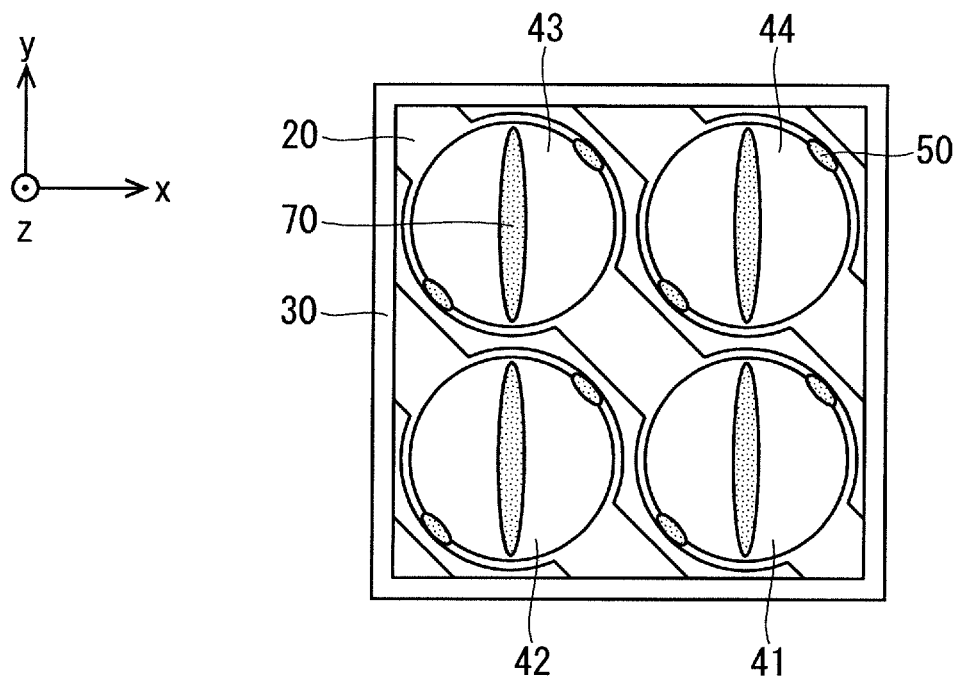
FIG. 16 A drawing illustrating a region where the output light passes through the output surface of the lens when the laser light source apparatus is driven.
Figure 17:
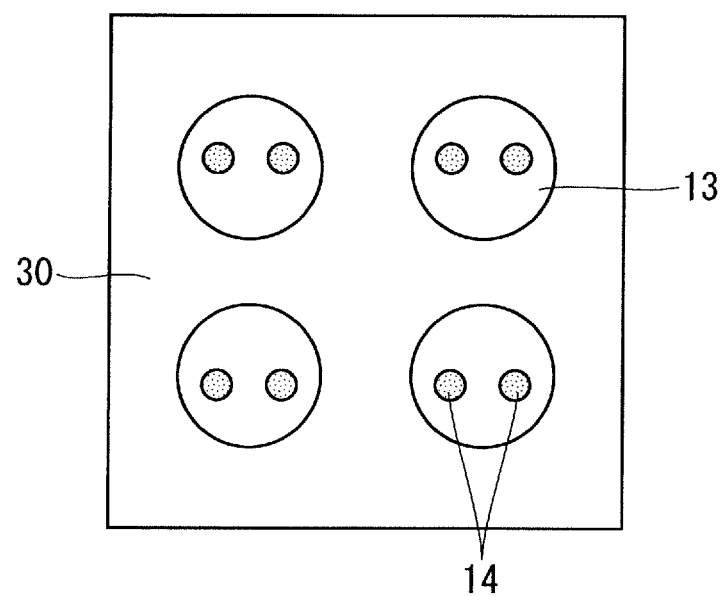
FIG. 17 A drawing for explaining a direction of the lead pin in the case illustrated in FIG. 16.

Described next is a relationship between a region where the output light 70 passes through the output surfaces of the lenses 41 to 44 and the direction of the lead pin 14. FIG. 14 is a drawing illustrating a region where the output light 70 passes through the output surfaces of the lenses 41 to 44 when the laser light source apparatus 1 is driven. FIG. 15 is a drawing for explaining the direction of the lead pin 14 in the case illustrated in FIG. 14. FIG. 16 is a drawing illustrating a region where the output light 70 passes through the output surfaces of the lenses 41 to 44 when the laser light source apparatus 1 is driven. FIG. 17 is a drawing for explaining the direction of the lead pin 14 in the case illustrated in FIG. 16.

The directions of the semiconductor laser elements 101 to 104 are preferably set in a manner illustrated in FIG. 14 to FIG. 17 so that an electrical wiring from an external drive system to the lead pin 14 can be easily performed, and at this time, the region where the output light 70 being output from the semiconductor laser elements 101 to 104 passes through the output surfaces of the lenses 41 to 44 has a flat shape along the x axis and the y axis.

Specifically, as illustrated in FIG. 14 and FIG. 15, when the semiconductor laser elements 101 to 104 are arranged so that the two lead pins 14 in each of the semiconductor laser elements 101 to 104 are parallel to a y axis direction, the region where the output light 70 being output from the semiconductor laser elements 101 to 104 passes through the output surfaces of the lenses 41 to 44 has the flat shape along the x axis. As illustrated in FIG. 16 and FIG. 17, when the semiconductor laser elements 101 to 104 are arranged so that the two lead pins 14 in each of the semiconductor laser elements 101 to 104 are parallel to an x axis direction, the region where the output light 70 being output from the semiconductor laser elements 101 to 104 passes through the output surfaces of the lenses 41 to 44 has the flat shape along the y axis.

As described above, the laser light source apparatus 1 according to the embodiment 1 includes: the base 30 whose upper surface is the flat surface; the semiconductor laser elements 101 to 104 arranged on the upper surface of the base 30 and also on the lattice points which are the intersection points between an x axis group and a y axis group, in which the x axis directed to the direction parallel to the upper surface of the base 30 and the y axis directed to the direction parallel to the upper surface of the base 30 and the direction intersecting with the x axis are arranged, respectively; the plurality of lenses 41 to 44 parallelizing the laser light being output from the plurality of semiconductor laser elements 101 to 104; the spacer 20 disposed on the upper surface of the base 30 to support the plurality of lenses 41 to 44; and the adhesive agent 50 fixing the plurality of lenses 41 to 44 to the spacer 20, wherein the spacer 20 includes, for each of the lenses 41 to 44, the annular support surface 20b supporting the lower surfaces of the lenses 41 to 44 and the wall 20c to which the side surfaces of the lenses 41 to 44 are fixed by the adhesive agent 50, and the wall 20c has the clearance groove 20d formed along the direction connecting the diagonal points of the lattice points.

The method of manufacturing the laser light source apparatus 1 according to the embodiment 1 includes: Step (a) of fixing the plurality of semiconductor laser elements 101 to 104 to the base 30; Step (b) of fixing the spacer 20 to the upper surface of the base 30; Step (c) of applying the adhesive agent 50 on the spacer 20; Step (d) of locating the lenses 41 to 44 in the spacer 20; Step (e) of grasping the lenses 41 to 44 along the clearance groove 20d and adjusting the positions of the lenses 41 to 44; and Step (f) of hardening the adhesive agent 50 and fixing the lenses 41 to 44, and Step (d) to Step (f) are repeated for each of the lenses 41 to 44.

Accordingly, the laser light source apparatus 1 does not include the lens tube for holding the lens, but the plurality of lenses 41 to 44 are fixed to the spacer 20, thus the high in-plane mounting density in the semiconductor laser elements 101 to 104 can be achieved. The lenses 41 to 44 can be grasped along the clearance groove 20d provided in the spacer 20, thus the positions of the lenses 41 to 44 can be adjusted with the high degree of accuracy.

Furthermore, the adhesion area between the lenses 41 to 44 and the spacer 20 is increased using the wall 20c, thus the fixation strength by the adhesion can be easily increased. According to the above configurations, the downsizing and the improvement in the durability of the laser light source apparatus 1 can be achieved.

The adhesive agent 50 is disposed on the two positions facing each other with the lenses 41 to 44 therebetween in the region between the side surfaces of the lenses 41 to 44 and the wall 20c, and the adhesive agent 50 is disposed outside the region where the output light 70 being output from the semiconductor laser elements 101 to 104 passes through the output surfaces of the lenses 41 to 44.

Accordingly, the interference between the output light 70 and the adhesive agent 50 extending into the output surfaces and the entrance surfaces of the lenses 41 to 44 can be prevented. The region up to outer edges of the lenses 41 to 44 can be used as the effective output surfaces, thus a freedom degree of an optical design increases. There is no vignetting of the output light caused by the adhesive agent 50, thus a lens binding efficiency can be kept high. An amount of direct irradiation of the adhesive agent 50 with the output light 70 is small, thus an increase in the temperature of the adhesive agent 50 can be reduced, and an internal deterioration of the laser light source apparatus 1 can be reduced.

The adhesive agent 50 is disposed on an extended line in the direction different from that in which the clearance groove 20d is formed in the two directions connecting the diagonal points of the lattice points. Accordingly, it is possible to suppress the adhesive agent 50 sticking out to reach the lens grasping mechanism 60 when the lenses 41 to 44 are grasped from the direction orthogonal to the direction connecting the two positions where the adhesive agent 50 is disposed and subsequently the positions of the lenses 41 to 44 are adjusted. Accordingly, the adhesive agent 50 reaches the region between the lens grasping mechanism 60 and the side surfaces of the lenses 41 to 44, thus the deviation of the positions of the lenses 41 to 44 after releasing the lens grasp can be suppressed.

The semiconductor laser elements 101 to 104 which are the TO-Can package elements easy to be handled are used, thus the laser light source apparatus 1 in which the positions of the lenses 41 to 44 are adjusted at high output power with the high degree of accuracy can be provided.

An arrangement interval of the x axis group and an arrangement interval of the y axis group are equal to each other, thus the semiconductor laser elements 101 to 104 can be disposed so that the interval therebetween is narrowed. Accordingly, the downsizing of the laser light source apparatus 1 can be achieved.

The x axis group and the y axis group are orthogonal to each other, thus the semiconductor laser elements 101 to 104 can be disposed so that the interval therebetween is narrowed. Accordingly, the downsizing of the laser light source apparatus 1 can be achieved.

Modification Example of Embodiment 1

Figure 18:
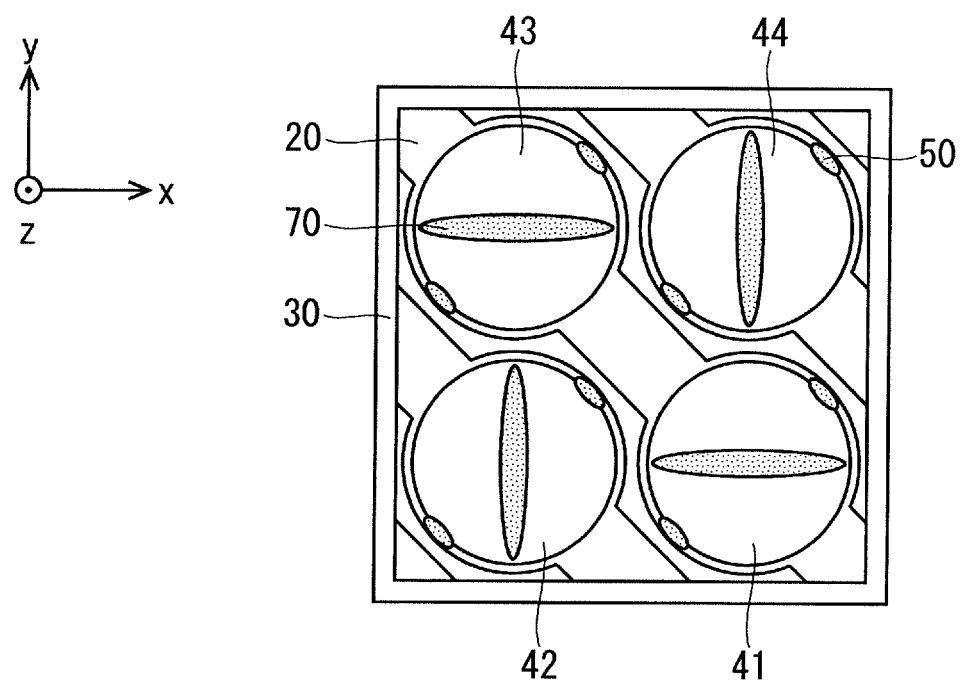
FIG. 18 A drawing illustrating a region where the output light passes through the output surface of the lens when a laser light source apparatus according to a modification example 1 of an embodiment 1 is driven.
Figure 19:
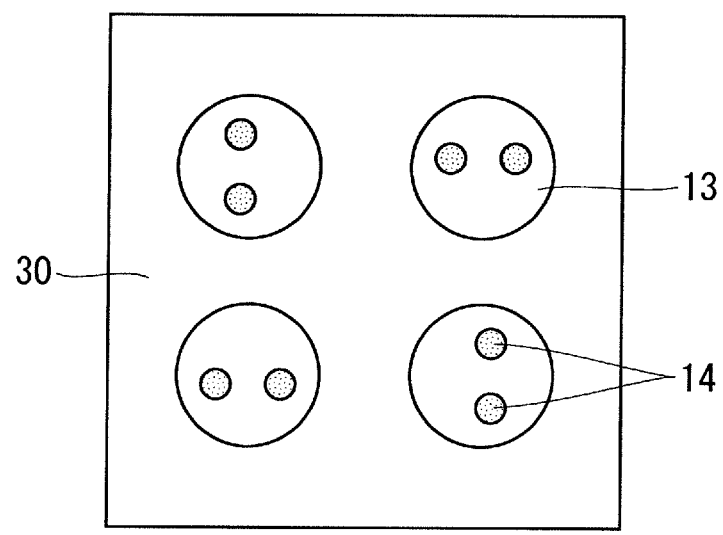
FIG. 19 A drawing for explaining a direction of the lead pin in the case illustrated in FIG. 18.

Next, a modification example of the embodiment 1 is described. FIG. 18 is a drawing illustrating a region where the output light 70 passes through the output surfaces of the lenses 41 to 44 when the laser light source apparatus 1 according to a modification example 1 of the embodiment 1 is driven. FIG. 19 is a drawing for explaining the direction of the lead pin 14 in the case illustrated in FIG. 18.

As illustrated in FIG. 18 and FIG. 19, the two lead pins 14 arranged parallel to the x axis direction and those arranged parallel to the y axis direction may be mixedly disposed. In this case, an electrical wiring becomes complicated by reason that the lead pins 14 directed to the directions parallel to the x axis direction and the y axis direction are mixedly disposed, however, an optical axis of the output light 70 being output from each of the semiconductor laser elements 101 to 104 can be rotated by 90 degrees with respect to each other in the single laser light source apparatus 1. Accordingly, a speckle reduction effect caused by a polarization multiplex in the output light 70 can be obtained. The speckle indicates a random particulate pattern seen when the output light of the laser is projected on a screen, and is a phenomenon which causes a problem when the laser is used as a light source of the projection display apparatus.

Figure 20:
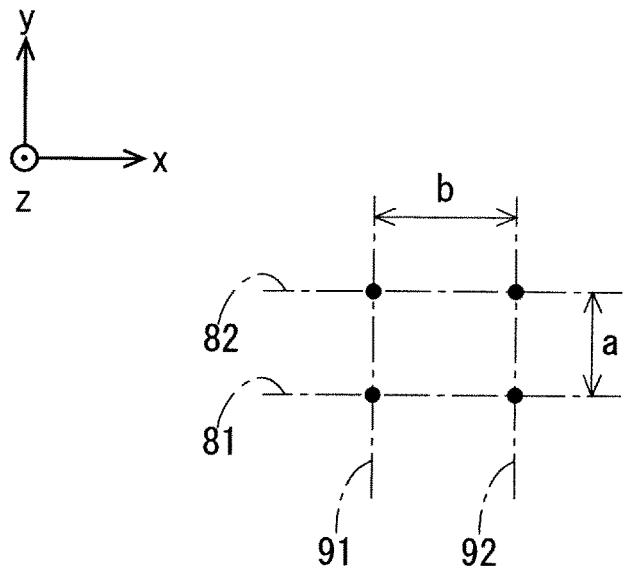
FIG. 20 A diagram for explaining an arrangement of the semiconductor laser element in a modification example 2 of the embodiment 1.
Figure 21:
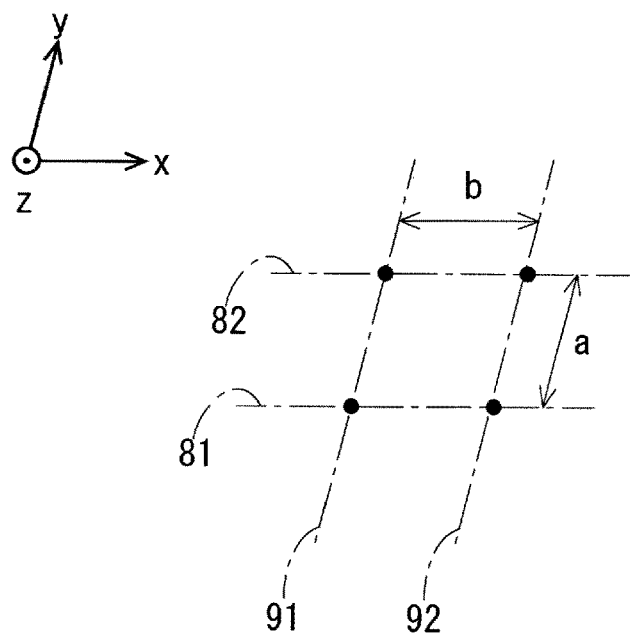
FIG. 21 A diagram for explaining an arrangement of the semiconductor laser element in a modification example 3 of the embodiment 1.

FIG. 20 is a drawing for explaining the arrangement of the semiconductor laser elements 101 to 104 according to a modification example 2 of the embodiment 1. FIG. 21 is a drawing for explaining the arrangement of the semiconductor laser elements 101 to 104 according to a modification example 3 of the embodiment 1.

The number of the semiconductor laser elements 101 to 104 and the arrangement interval therebetween are parameters which can be increased and reduced in accordance with a required total light output and an optical design of a projector.

As illustrated in FIG. 5, when the expression of a=b is satisfied and applied is the combination of the square lattice in which of the straight lines 81 and 82 and the straight lines 91 and 92 are orthogonal to each other, the densest arrangement of the semiconductor laser elements 101 to 104, which is the most preferable configuration, can be achieved, however, the other arrangement can also have the effect similar to the case of the embodiment 1. For example, as illustrated in FIG. 20, also applicable is a configuration that an expression of a<b is satisfied and the straight lines 81 and 82 and the straight lines 91 and 92 are orthogonal to each other. As illustrated in FIG. 21, also applicable is a configuration that an expression of a=b is satisfied and the straight lines 81 and 82 and the straight lines 91 and 92 are not orthogonal to each other.

In each of the lenses 41 to 44, the entrance surface needs not necessarily be formed into the flat surface, but may be formed into a curved shape of concave or convex shape. However, the entrance surface of each of the lenses 41 to 44 is preferably formed into the flat surface in a range in which the entrance surface may have contact with the upper surface of the spacer 20 in the process of aligning the lenses 41 to 44 within the range of the upper surface of the spacer 20 parallel to the x axis and the y axis.

Each of the output surface and the entrance surface of the lenses 41 to 44 needs not be the axisymmetric curved surface, however, a cylindrical lens may also be applied so that the output surface or the entrance surface has a shape of parallelizing the output light 70 being output from the semiconductor laser elements 101 to 104 only in the fast axis direction, for example.

The position where the adhesive agent 50 is applied needs not necessarily be located on the extended line in the direction connecting the diagonal points of the lattice points where the semiconductor laser elements 101 to 104 are located, however, the adhesive agent 50 may be applied in any position outside the region where the output light 70 being output from the semiconductor laser elements 101 to 104 passes through the output surfaces of the lenses 41 to 44.

Embodiment 2

Figure 22:
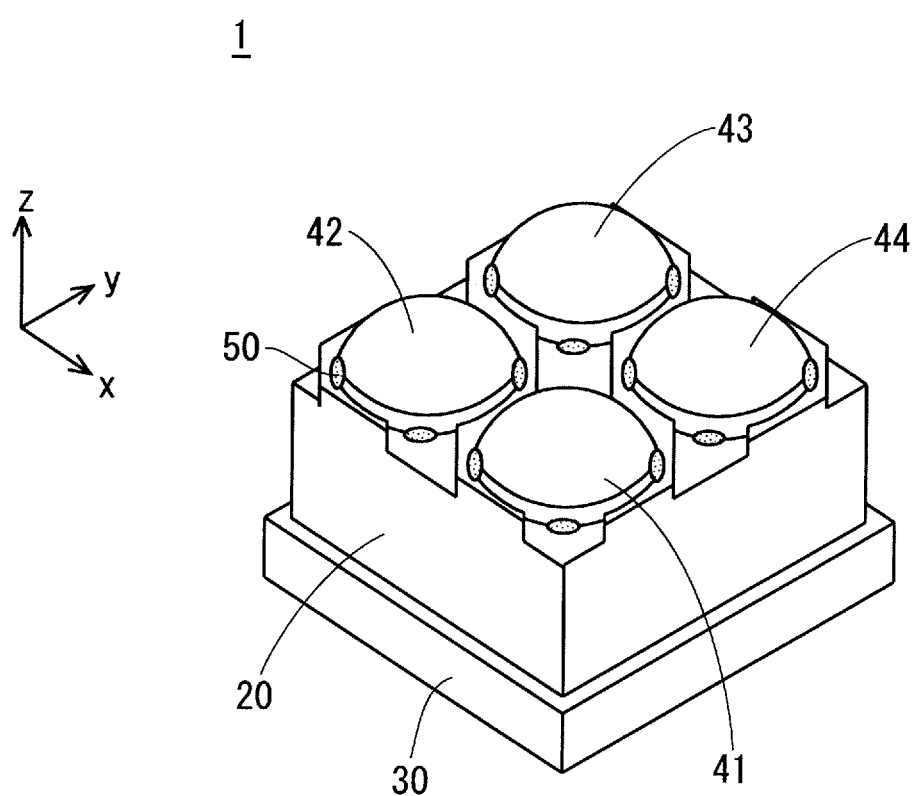
FIG. 22 A perspective view of a laser light source apparatus according to an embodiment 2.
Figure 23:
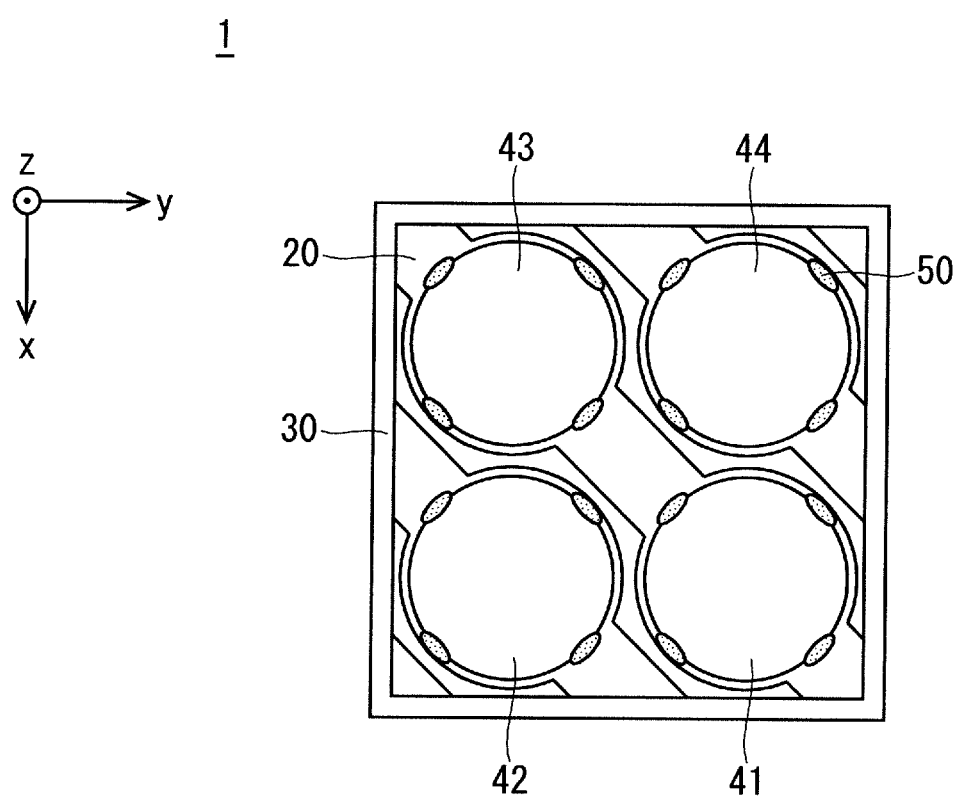
FIG. 23 A plan view of a laser light source apparatus according to the embodiment 2.

Next, a laser light source apparatus 1 according to an embodiment 2 is described. FIG. 22 is a perspective view of the laser light source apparatus 1 according to the embodiment 2. FIG. 23 is a plan view of the laser light source apparatus 1 according to the embodiment 2. FIG. 24 is a flow chart illustrating an example of a method of manufacturing the laser light source apparatus 1 according to the embodiment 2. In the description of the embodiment 2, the same reference numerals are assigned to the same constituent elements described in the embodiment 1, and the description thereof is omitted.

As illustrated in FIG. 22 and FIG. 23, in the embodiment 2, the adhesive agent 50 is further applied on two positions facing each other with each of the lenses 41 to 44 therebetween in a region between the side surface of each of the lenses 41 to 44 and the clearance groove 20d in addition to the two positions where the adhesive agent 50 is applied in the embodiment 1. That is to say, the adhesive agent 50 is applied on the four positions at regular intervals along the side surface of each of the lenses 41 to 44.

Next, a method of manufacturing the laser light source apparatus 1 according to the embodiment 2 is briefly described. As illustrated in FIG. 24, an additional adhesion process is performed (Step S11) after the processes of Step S1 to Step S7 are performed, that is to say, after the position adjustment for all the lenses 41 to 44 is finished, thus the adhesive agent 50 can be applied on a diagonal direction on an opposite side of the position where the adhesive agent 50 is applied in the embodiment 1 as described above. The lenses 41 to 44 are already fixed to the spacer 20 by the adhesion, thus the hardening processing by the ultraviolet irradiation is not necessary.

As described above, in the laser light source apparatus 1 according to the embodiment 2, the adhesive agent 50 is further applied on the two positions facing each other with each of the lenses 41 to 44 therebetween in the region between the side surface of each of the lenses 41 to 44 and the clearance groove 20d in addition to the two positions.

Accordingly, the adhesion area between the lenses 41 to 44 and the spacer 20 is increased, thus the larger fixation strength can be obtained. Each of the lenses 41 to 44 and the spacer 20 are fixed on the four positions at the regular intervals by the adhesion, thus a dependence property of the fixation strength in a direction in which an external load is added and a direction of added impact decreases. The deviation of the positions of the lenses 41 to 44 caused by a thermal shrinkage of the adhesive agent 50 can be suppressed when the adhesive agent 50 is hardened and the laser light source apparatus 1 operates.

The modification example of the embodiment 1 described above can also be adopted to the laser light source apparatus 1 according to the embodiment 2.

Although the present invention is described in detail, the foregoing description is in all aspects illustrative and does not restrict the invention. It is therefore understood that numerous modifications and variations can be devised without departing from the scope of the invention.

According to the present invention, the above embodiments can be arbitrarily combined, or each embodiment can be appropriately varied or omitted within the scope of the invention.

EXPLANATION OF REFERENCE SIGNS 1 laser light source apparatus, 20 spacer, 20b support surface, 20c wall, 20d clearance groove, 30 base, 41 to 44 lens, 50 adhesive agent, 101 to 104 semiconductor laser element.

The invention claimed is:
1. A laser light source apparatus, comprising:
a base whose upper surface is a flat surface;
a plurality of laser light source elements arranged on the upper surface of the base and also on lattice points which are intersection points between an x axis group and a y axis group, in which an x axis directed to a direction parallel to the upper surface of the base and a y axis directed to a direction parallel to the upper surface of the base and a direction intersecting with the x axis are arranged, respectively;
a plurality of lenses parallelizing laser light being output from the plurality of laser light source elements;

a spacer disposed on the upper surface of the base to support the plurality of lenses; and an adhesive agent fixing the plurality of lenses to the spacer, wherein the spacer includes, for each of the lenses, an annular support surface supporting a lower surface of each of the lenses and a wall to which a side surface of each of the lenses is fixed by the adhesive agent, and the wall has a clearance groove formed along a direction connecting diagonal points of the lattice points.

2. The laser light source apparatus according to claim 1, wherein the adhesive agent is disposed on two positions facing each other with each of the lenses therebetween in a region between a side surface of each of the lenses and the wall, and the adhesive agent is disposed outside a region where laser light being output from each of the laser light source elements passes through an output surface of each of the lenses.

3. The laser light source apparatus according to claim 2, wherein the adhesive agent is disposed on an extended line in a direction different from a direction in which the clearance groove is formed in two directions connecting the diagonal points of the lattice points.

4. The laser light source apparatus according to claim 2, wherein the adhesive agent is further disposed on two positions facing each other with each of the lenses therebetween in a region between the side surface of each of the lenses and the clearance groove in addition to the two positions.

5. The laser light source apparatus according to claim 1, wherein an arrangement interval of the x axis group and an arrangement interval of the y axis group are equal to each other.

6. The laser light source apparatus according to claim 1, wherein the x axis group and the y axis group are orthogonal to each other.

7. A method of manufacturing a laser light source apparatus for manufacturing the laser light source apparatus according to claim 1, comprising:

(a) a step of fixing the plurality of laser light source elements to the base;

(b) a step of fixing the spacer to the upper surface of the base;

(c) a step of applying the adhesive agent to the spacer;

(d) a step of locating the lenses on the spacer;

(e) a step of grasping the lenses along the clearance groove and adjusting positions of the lenses; and (f) a step of hardening the adhesive agent and fixing the lenses, wherein the steps of (d) to (f) are repeated for each of the lenses.

* * * * *